(12) United States Patent
Takagi et al.

(10) Patent No.: US 9,712,142 B2
(45) Date of Patent: Jul. 18, 2017

(54) HIGH FREQUENCY SEMICONDUCTOR DEVICE

(71) Applicant: Kabushiki Kaisha Toshiba, Minato-ku (JP)

(72) Inventors: Kazutaka Takagi, Kawasaki (JP); Tomohito Oomori, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/615,859

(22) Filed: Feb. 6, 2015

(65) Prior Publication Data

US 2015/0280697 A1 Oct. 1, 2015

(30) Foreign Application Priority Data

Mar. 31, 2014 (JP) .................................. 2014-072450

(51) Int. Cl.
  *H03H 7/38* (2006.01)
  *H03F 3/68* (2006.01)
  *H03K 5/1252* (2006.01)

(52) U.S. Cl.
  CPC .. *H03K 5/1252* (2013.01); *H01L 2224/49175* (2013.01)

(58) Field of Classification Search
  CPC  H03K 5/1252; H03F 3/68; H03F 3/04; H01L 224/49175
  USPC ........ 330/273, 276, 275, 295, 302; 333/127, 333/128, 32; 257/296, 379
  See application file for complete search history.

(56) References Cited

U.S. PATENT DOCUMENTS

| | | | | |
|---|---|---|---|---|
| 5,955,926 | A * | 9/1999 | Uda .................. | H03F 3/604 330/295 |
| 6,005,442 | A * | 12/1999 | Maeda ................ | H03F 3/604 330/295 |
| 6,943,289 | B2 * | 9/2005 | Staudinger .......... | H01P 1/127 174/115 |
| 8,022,769 | B2 | 9/2011 | Ng et al. | |
| 8,533,528 | B2 * | 9/2013 | Maciorowski ...... | G06F 1/189 713/330 |
| 8,542,077 | B2 | 9/2013 | Masuda | |

(Continued)

FOREIGN PATENT DOCUMENTS

| | | |
|---|---|---|
| JP | 10-163772 | 6/1998 |
| JP | 10-233637 | 9/1998 |

(Continued)

*Primary Examiner* — Dinh T Le
(74) *Attorney, Agent, or Firm* — Oblon, McClelland, Maier & Neustadt, L.L.P.

(57) ABSTRACT

Certain embodiments provide a high frequency semiconductor device including a plurality of unit FETs, an input dividing/matching circuit, an output combining/matching circuit, and a low-frequency-oscillation-suppressing-circuit. The input dividing/matching circuit has an input end and a plurality of divided output ends connected to the unit FETs, and is symmetrical about a center axis of the input end. The output combining/matching circuit has an output end and a plurality of divided input ends connected to the unit FETs, and is symmetrical about a center axis of the output end. The low-frequency-oscillation-suppressing-circuit is connected to at least one of the input end of the input dividing/matching circuit and the output end of the output combining/matching circuit.

19 Claims, 5 Drawing Sheets

(56) References Cited

U.S. PATENT DOCUMENTS

| | | |
|---|---|---|
| 8,610,381 B2 | 12/2013 | Utsuno |
| 8,786,369 B2 | 7/2014 | Takagi |
| 2012/0199847 A1 | 8/2012 | Takagi |
| 2014/0091779 A1 | 4/2014 | Utsuno |
| 2014/0252416 A1 | 9/2014 | Takagi |
| 2014/0252658 A1 | 9/2014 | Takagi |

FOREIGN PATENT DOCUMENTS

| | | |
|---|---|---|
| JP | 2002-335136 | 11/2002 |
| JP | 2011-254439 | 12/2011 |
| JP | 2012-156963 | 8/2012 |

* cited by examiner

HIGH FREQUENCY SEMICONDUCTOR DEVICE

CROSS REFERENCE TO RELATED APPLICATIONS

This application is based upon and claims the benefit of priority from the prior Japanese Patent Application No. 2014-072450 filed in Japan on Mar. 31, 2014; the entire contents of which are incorporated herein by reference.

FIELD

Embodiments described herein relate generally to a high frequency semiconductor device.

BACKGROUND

In a conventional high frequency semiconductor device in which a plurality of field effect transistors (FET) are arranged in parallel, for example, an input dividing/matching circuit is arranged on the input side of the unit FETs, and an output combining/matching circuit is arranged on the output side of the unit FETs. Such a conventional high frequency semiconductor device has gain in a wide bandwidth from a high frequency band to a low frequency band, and oscillators may occur at various frequencies in the device.

Thus, the output end of the input dividing/matching circuit and the input end of the output combining/matching circuit are divided for some unit FETs in the conventional high frequency semiconductor device in order to suppress high frequency oscillations on the GHz order, for example. Resistors (so-called isolation resistors or balance resistors) are provided between the divided output ends and between the divided input ends, respectively.

Further, in the conventional high frequency semiconductor device, low-frequency-oscillation-suppressing-circuits in which an inductor L, a resistor R, and a capacitor C are connected in series are connected to the unit FETs arranged at both ends among the unit FETs arranged in parallel in order to suppress low frequency oscillations on the MHz order occurring in the high frequency semiconductor device, for example.

In the conventional high frequency semiconductor device, however, the divided output ends of the input dividing/matching circuit and the divided input ends of the output combining/matching circuit are connected via the isolation resistors. Thus, there are plurality of isolation resistors between the unit FETs arranged near the center of the unit FETs arranged in parallel, and the low-frequency-oscillation-suppressing-circuits. Thus, a resistor with a high resistance value is formed between the unit FETs arranged near the center and the low-frequency-oscillation-suppressing-circuits, respectively, and the unit FETs arranged near the center are not substantially connected to the low-frequency-oscillation-suppressing-circuits. Therefore, the low-frequency-oscillation-suppressing-circuits work on at least the unit FETs arranged at both ends, but the low-frequency-oscillation-suppressing-circuits do not work enough on the unit FETs arranged at near the center. There is a problem that the low-frequency-oscillation-suppressing-circuits hardly work on the unit FETs arranged near the center and it is difficult to suppress low frequency oscillations.

There is a problem that when the output end of the input dividing/matching circuit and the input end of the output combining/matching circuit are not divided and a plurality of unit FETs are connected to one undivided output end and one undivided input end in order to solve the above problem, high frequency oscillations may occur.

That is, there is a problem that it is difficult to suppress both low frequency oscillations and high frequency oscillations in the conventional high frequency semiconductor device.

If the output ends of the input dividing/matching circuit and the input end of the output combining/matching circuit are divided, respectively, and the low-frequency-oscillation-suppressing-circuits are connected for each unit FETs, both low frequency oscillations and high frequency oscillations can be suppressed. However, an extremely large number of low-frequency-oscillation-suppressing-circuits are required, and thus a size of the high frequency semiconductor device becomes extremely large. Thus, such a solution is not practical.

DESCRIPTION OF THE EMBODIMENTS

Certain embodiments provide a high frequency semiconductor device including a plurality of unit FETs, an input dividing/matching circuit, an output combining/matching circuit, and a low-frequency-oscillation-suppressing-circuit. The input dividing/matching circuit has an input end and a plurality of divided output ends connected to the unit FETs, and is symmetrical about a center axis of the input end. The output combining/matching circuit has an output end and a plurality of divided input ends connected to the unit FETs, and is symmetrical about a center axis of the output end. The low-frequency-oscillation-suppressing-circuit is connected to at least one of the input end of the input dividing/matching circuit and the output end of the output combining/matching circuit.

Certain embodiments provide a high frequency semiconductor device including a plurality of unit FETs, an input dividing/matching circuit, an output combining/matching circuit, and a plurality of low-frequency-oscillation-suppressing-circuits. The input dividing/matching circuit has an input end and a plurality of divided output ends connected to the unit FETs, and is symmetrical about a center axis of the input end. The output combining/matching circuit has an output end and a plurality of divided input ends connected to the unit FETs, and is symmetrical about a center axis of the output end. The low-frequency-oscillation-suppressing-circuits are connected to the input end of the input dividing/matching circuit and the output end of the output combining/matching circuit.

The high frequency semiconductor device according to the embodiments will be described below.

Figure 1:
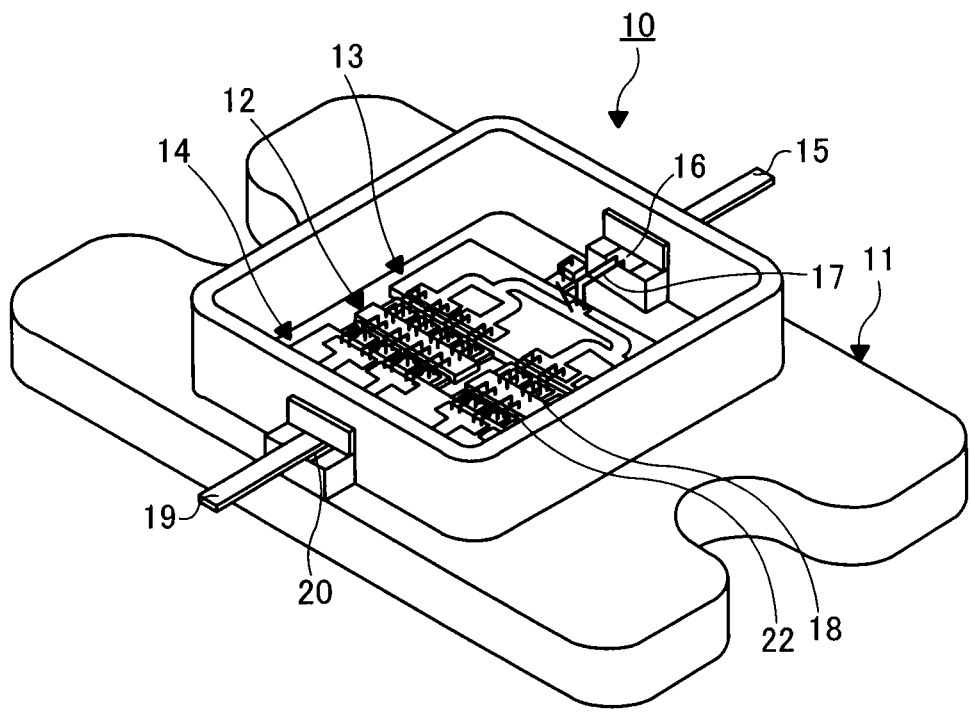
FIG. 1 is a perspective view schematically illustrating a high frequency semiconductor device according to an embodiment.
Figure 2:
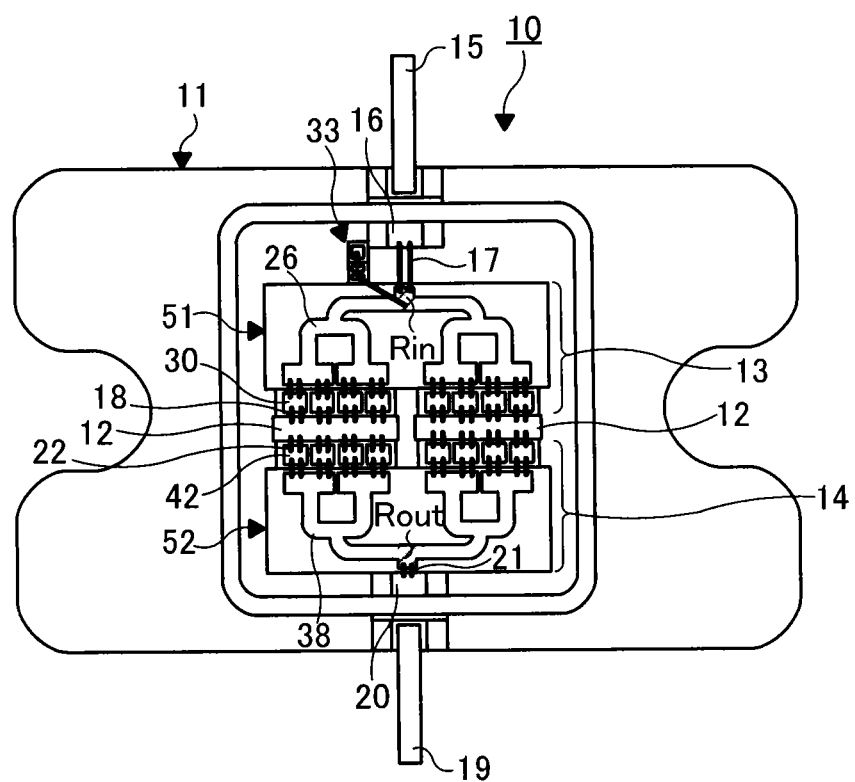
FIG. 2 is a top view schematically illustrating the high frequency semiconductor device according to the embodiment.

FIG. 1 is a perspective view schematically illustrating the high frequency semiconductor device according to the embodiment, and FIG. 2 is a top view schematically illustrating the high frequency semiconductor device according to the embodiment. As illustrated in FIG. 1 and FIG. 2, in the high frequency semiconductor device 10 according to the embodiment, a plurality of FET chips 12 as high frequency power amplifiers are arranged in parallel in a high frequency semiconductor package 11. Each FET chip 12 is formed by arranging a plurality of field effect transistors (unit FETs) in parallel. In the high frequency semiconductor package 11, an input dividing/matching circuit 13 is provided on the input side of the FET chips 12 and an output combining/matching circuit 14 is provided on the output side of the FET chips 12.

The high frequency semiconductor package 11 has an input pattern 16 connected to an input lead wire 15, and the input end of the input dividing/matching circuit 13 is connected to the input pattern 16 via a connection conductor 17 inside the package 11. A plurality of divided output ends of the input dividing/matching circuit 13 are connected to the FET chips 12 via connection conductors 18. In the present embodiment, each of the divided output ends of the input dividing/matching circuit 13 is each of upper electrodes 30 of a plurality of capacitors 27 described later, respectively.

Similarly, the high frequency semiconductor package 11 has an output pattern 20 connected to an output lead wire 19, and the output end of the output combining/matching circuit 14 is connected with the output pattern 20 via a connection conductor 21 inside the package 11. A plurality of divided input ends of the output combining/matching circuit 14 are connected to the FET chips 12 via connection conductors 22. In the present embodiment, each of the divided input ends of the output combining/matching circuit 14 is each of upper electrodes 42 of a plurality of capacitors 39 described later, respectively.

Figure 3:
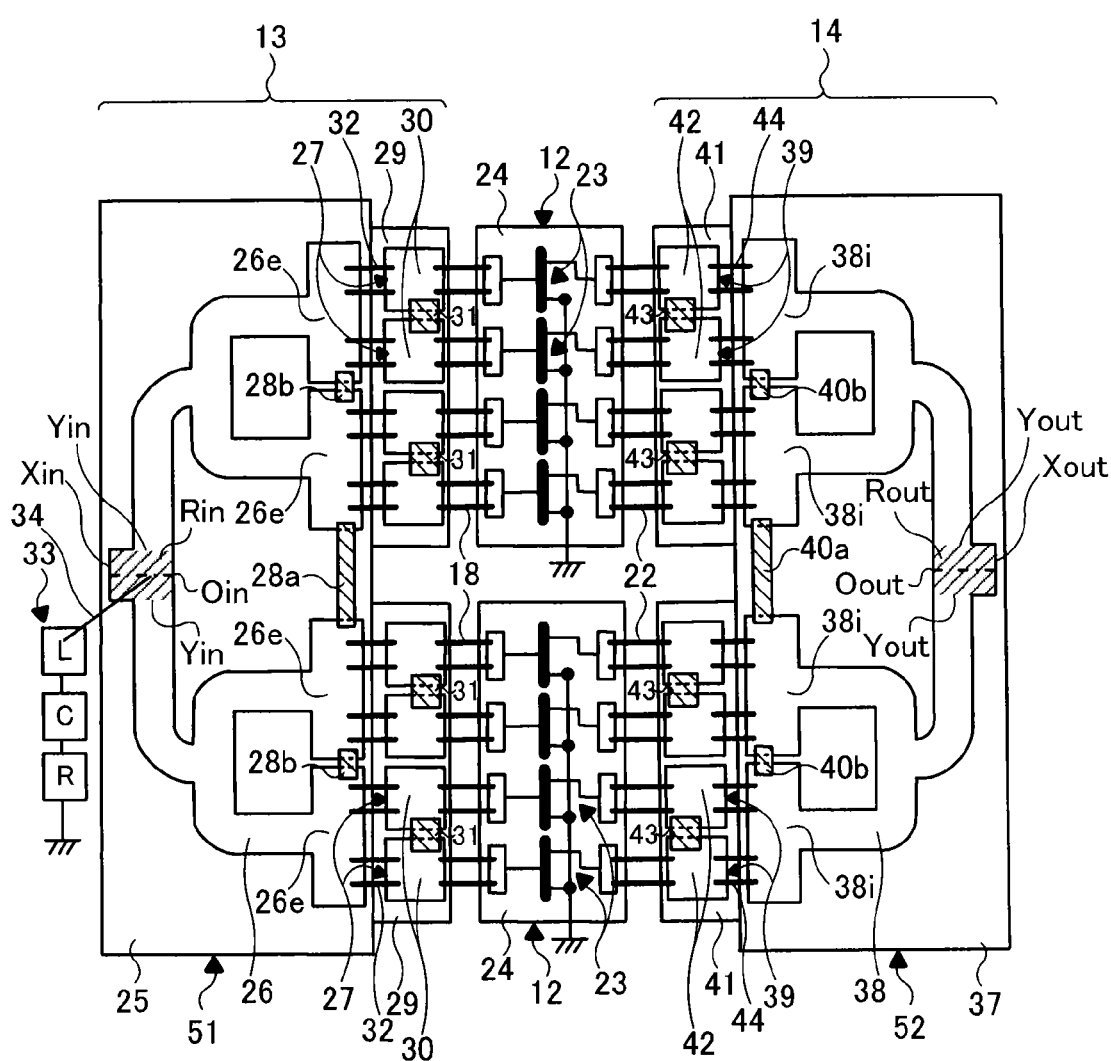
FIG. 3 is a top view schematically illustrating a structure inside a high frequency semiconductor package of the high frequency semiconductor device according to the embodiment.
Figure 4:
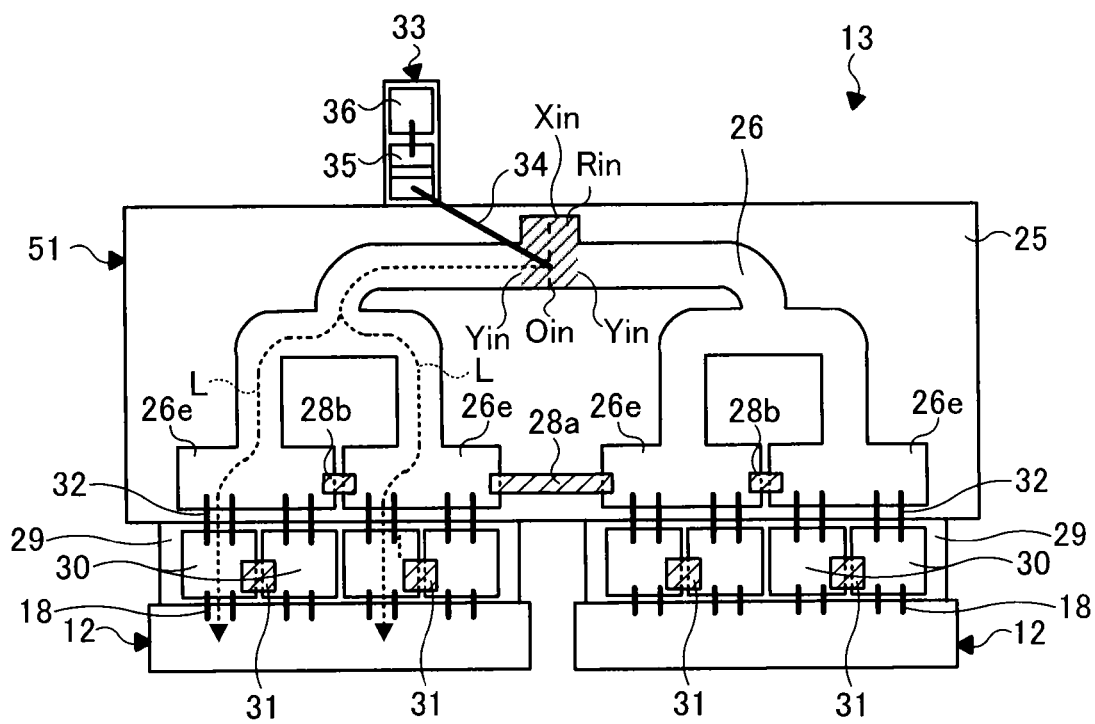
FIG. 4 is a top view illustrating essential parts inside the high frequency semiconductor package of the high frequency semiconductor device according to the embodiment in an enlarged manner.

FIG. 3 is atop view schematically illustrating a structure inside the high frequency semiconductor package 11 of the high frequency semiconductor device 10 according to the embodiment. FIG. 4 is a top view illustrating essential parts inside the high frequency semiconductor package 11 of the high frequency semiconductor device 10 according to the embodiment in an enlarged manner. As illustrated in FIG. 3, each FET chip 12 is formed by arranging a plurality of unit FETs 23 in parallel on a semiconductor substrate 24, for example.

As illustrated in FIG. 3 and FIG. 4, the input dividing/matching circuit 13 provided on the input side of the FET chips 12 has a dividing circuit 51 including an insulative substrate 25 and a dividing line 26 on the surface of the insulative substrate 25. The input dividing/matching circuit 13 has a plurality of capacitors 27 arranged in parallel. The number of capacitors 27 configuring the input dividing/matching circuit 13 matches with the total number of unit FETs 23 provided in the FET chips 12. That is, the number of divided output ends of the input dividing/matching circuit 13 matches with the total number of unit FETs 23.

The dividing line 26 of the dividing circuit 51 is a microstrip line which repeats 2-branch from the input side toward the output side, and is symmetrical about a center axis Oin of the input end. In the present embodiment, the input end of the dividing line 26 means a region Rin surrounded by one end Xin on the input side and a boundary region Yin connected with the branched line as illustrated in FIG. 3 and FIG. 4.

The output end of the dividing line 26 is divided into a plurality of ends. In the present embodiment, the number of divided output ends of the dividing line 26 is less than the total number of unit FETs 23 provided in the FET chips 12. The dividing line 26 has a plurality of divided output ends such that one divided output end 26e corresponds to two mutually adjacent unit FETs 23. A resistor 28a is provided between the thus-divided output ends 26e. Thus, odd mode oscillations (high frequency oscillations) on the GHz order occurring in a closed loop including eight adjacent unit FETs 23, for example, can be suppressed. Further, a phase of an operation h frequency input at the divided output ends 26e is different from each other, and thus even if a voltage difference is caused between the output ends 26e, it is possible to reduce the voltage difference. A resistor 28b is provided between other divided output ends 26e. Thus, odd mode oscillations (high frequency oscillations) on the GHz order occurring in a closed loop including four adjacent unit FETs 23, for example, can be suppressed. Further, a phase of an operation frequency at the divided output ends 26e is different from each other, and thus even if a voltage difference is caused between the output ends 26e, it is possible to reduce the voltage difference.

The resistors 28a and 28b are made of tungsten, tantalum nitride, or the like. The length and the like of the resistors 28a and 28b are not limited, and the divided output ends 26e of the dividing line 26 have only to be connected via the resistors 28a and 28b.

The capacitors 27 are configured of a plurality of upper electrodes 30 arranged and formed in parallel on the surface of a dielectric substrate 29, and a lower electrode (not illustrated) uniformly formed on the backside of the dielectric substrate 29.

The upper electrodes 30 are arranged apart from each other on the surface of the dielectric substrate 29, and a resistor 31 is provided between the adjacent upper electrodes 30 to contact with part of the surfaces of the adjacent upper electrodes 30. Thus, odd mode oscillations (high frequency oscillations) on the GHz order occurring in a closed loop including two adjacent unit FETs 23, for example, can be suppressed. Furthermore, a phase of an operation frequency at the mutually adjacent upper electrodes 30 is different from each other, and thus even if a voltage difference is caused between the upper electrodes 30, it is possible to reduce the voltage difference.

The resistor 31 is made of tungsten, tantalum nitride, or the like. The length and the like of the resistor 31 are not limited, and the upper electrodes 30 have only to be connected via the resistors 31.

The capacitors 27 are electrically connected to the dividing line 26 described above by connecting the divided output ends 26e of the dividing line 26 and the upper electrodes 30 of the capacitors 27 via a plurality of connection conductors 32.

In the input dividing/matching circuit 13 described above, the input end Rin of the dividing line 26 is the input end of the input dividing/matching circuit 13 and the upper electrodes 30 of the capacitors 27 arranged in series are the divided output ends of the input dividing/matching circuit 13. Thus, the input end Rin of the dividing line 26 as the input end of the input dividing/matching circuit 13 is connected with the input pattern 16 connected to the input lead wire 15 via the connection conductor 17 (FIG. 2). The upper electrodes 30 of the capacitors 27 as the divided output ends of the input dividing/matching circuit 13 are connected to the FET chips 12 (gate terminals of the unit FETs 23) via the connection conductors 18 (FIG. 2 and FIG. 3).

As illustrated in FIG. 3 and FIG. 4, the input end of the input dividing/matching circuit 13, that is the input end Rin of the dividing line 26, is connected with an inductor L, a capacitor C and a resistor R in series as a low-frequency-oscillation-suppressing-circuit 33. The low-frequency-oscillation-suppressing-circuit 33 attenuates oscillations in a selected frequency band at the resistor R by adjusting an inductance of the inductor L and a capacitance of the capacitor C. In the low-frequency-oscillation-suppressing-circuit 33, the inductor L and the capacitor C are selected so as to suppress even mode oscillations (low frequency oscillations) in the frequency band on the MHz order, for example.

Figure 5:
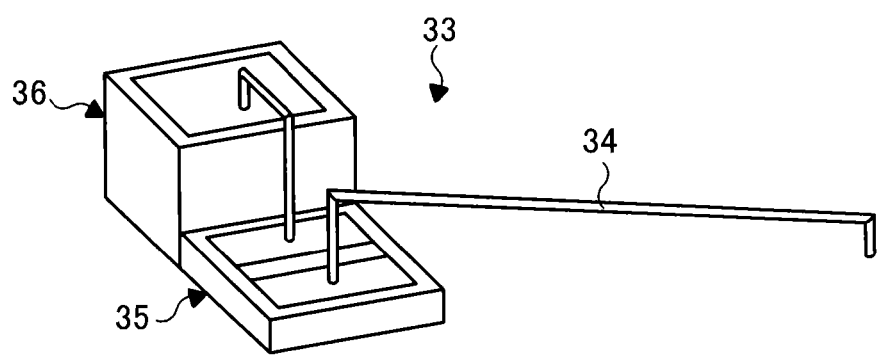
FIG. 5 is a perspective view illustrating a structure of a low-frequency-oscillation-suppressing-circuit.

Herein, as illustrated in FIG. 5, the inductor L of the low-frequency-oscillation-suppressing-circuit 33 is made of a wire 34 having a predetermined inductance, the capacitor C is made of a chip capacitor 35, and the resistor R is made of a chip resistor 36, respectively. For example, the low-frequency-oscillation-suppressing-circuit 33 is provided such that one end of the wire 34 is connected to the input end Rin of the dividing line 26 on the center axis Oin of the input end Rin of the dividing line 26 as illustrated in FIG. 3 and FIG. 4. An impedance of the inductor is proportional to a frequency. Thus, the wire 34 is set in a desired length so that an electrical length of the wire 34 can be sufficiently elongated in an operation frequency, an impedance of the wire 34 is remarkably increased, an electrical length of the wire 34 can be sufficiently shortened in a low frequency oscillation frequency, and an impedance of the wire can be remarkably reduced. As a result, the low-frequency-oscillation-suppressing-circuit 33 restricts suppresses an increase in loss in the operation frequency. The low-frequency-oscillation-suppressing-circuits 33 can reduce its energy to the ground via the resistor R thereby to restrict low frequency oscillations.

When the low-frequency-oscillation-suppressing-circuits 33 are provided in this way, as indicated in dotted lines L in FIG. 4, all the distances from the low-frequency-oscillation-suppressing-circuit 33 to the unit FETs 23 in the FET chips 12 can be made substantially equal, and no resistor is formed between a low-frequency-oscillation-suppressing-circuit 33 and each unit FET 23. Thus, the low-frequency-oscillation-suppressing-circuit 33 evenly works on all of the unit FETs 23.

Refer to FIG. 3. The output combining/matching circuit 14 provided on the output side of the FET chips 12 has a confluence circuit 52 including an insulative substrate 37 and a confluence line 38 on the surface of an insulative substrate 37. The output combining/matching circuit 14 has a plurality of capacitors 39 arranged in parallel. The number of capacitors 39 configuring the output dividing/matching circuit 14 matches with the total number of unit FETs 23 provided in the FET chips 12. That is, the number of divided input ends of the output dividing/matching circuit 14 matches with the total number of unit FETs 23.

The confluence line 38 is a microstrip line repeatedly combining two microstrip lines from the input side toward the output side, and is symmetrical about a center axis Oout of the output end. In the present embodiment, the output end of the confluence line 38 means a region Rout surrounded by one end Xout of the output side and a boundary region Yout connected with the branched line as illustrated in FIG. 3.

The confluence line 38 has a plurality of divided input ends. In the present embodiment, the number of divided input ends of the confluence line 38 is less than the total number of unit FETs 23 provided in the FET chips 12. The confluence line 38 has a plurality of divided input ends such that one divided input end 38i corresponds to two mutually adjacent unit FETs 23. A resistor 40a is provided between the thus-divided input ends 38i. Thus, odd mode oscillations (high frequency oscillations) on the GHz order occurring in a closed loop including eight adjacent unit FETs 23, for example, can be suppressed. Further, a phase of an operation frequency at the divided input ends 38i is different from each other, and even if a voltage difference is caused between the input ends 38i, the voltage difference can be absorbed. A resistor 40b is provided between other divided input ends 38i. Thus, odd mode oscillations (high frequency oscillations) on the GHz order occurring in a closed loop including four adjacent unit FETs 23, for example, can be restricted. Further, a phase of an operation frequency at the divided input ends 38i is different, and even if a voltage difference is caused between the input ends 38i, it is possible to reduce the voltage difference.

The resistors 40a and 40b are made of tungsten, tantalum nitride, or the like. The length and the like of the resistors 40a and 40b are not limited, and the divided input ends 38i of the confluence line 38 have only to be connected via the resistors 40a and 40b.

The capacitors 39 are configured similarly to the capacitors 27 of the input dividing/matching circuit 13, and are configured of the upper electrodes 42 arranged and formed in parallel on the surface of a dielectric substrate 41 and the lower electrode (not illustrated) uniformly formed on the backside of the dielectric substrate 41.

The upper electrodes 42 are arranged apart from each other on the surface of the dielectric substrate 41, and a resistor 43 is provided between the adjacent upper electrodes 42 to contact with part of the surfaces of the adjacent upper electrodes 42. Thus, odd mode oscillations (high frequency oscillations) on the GHz order occurring in a closed loop including two adjacent unit FETs 23, for example, can be suppressed. Further, a phase of an operation frequency at the mutually adjacent upper electrodes 43 is different from each other, and thus even if a voltage difference is caused between the upper electrodes 42, it is possible to reduce the voltage difference.

The resistor 43 is made of tungsten, tantalum nitride, or the like. The length and the like of the resistor 43 are not limited, and the upper electrodes 42 have only to be connected via the resistors 43.

The capacitors 39 are electrically connected to the confluence line 38 by connecting the upper electrodes 42 of the capacitors 39 and the divided input ends 38i of the confluence line 38 via connection conductors 44.

In the output combining/matching circuit 14 described above, the upper electrodes 42 of the capacitors 39 are the divided input ends of the output combining/matching circuit 14 and the output end Rout of the confluence line 38 is the output end of the output combining/matching circuit 14. Thus, the output end Rout of the confluence line 38 as the output end of the output combining/matching circuit 14 is connected with the output pattern 20 connected to the output lead 19 via the connection conductor 21 (FIG. 2). Then, the upper electrodes 42 of the capacitors as the divided input ends of the output combining/matching circuit 14 are connected with the FET chips 12 (drain terminals of the unit FETs 23) via the connection conductors 22 (FIG. 2 and FIG. 3).

In the above description, the connection conductors 17, 18, 21, 22, 32 and 44 are wires made of gold or the like, for example.

As described above, with the high frequency semiconductor device 10 according to the present embodiment, the input dividing/matching circuit 13 has a plurality of divided output ends, and the output combining/matching circuit 14 has a plurality of divided input ends. Then, the resistors 31 and 43 are provided between the divided output ends and between the divided input ends, respectively. Thus, high frequency oscillations can be suppressed.

Furthermore, the low-frequency-oscillation-suppressing-circuit 33 is provided such that one end of the wire 34 as the inductor L is connected to the input end Rin of the dividing line 26 on the center axis Oin of the input end Rin of the dividing line 26. Thus, the distances between the low-frequency-oscillation-suppressing-circuit 33 and the FETs 23 can be all made substantially equal. As a result, the low-frequency-oscillation-suppressing-circuit 33 can evenly work on all the unit FETs 23, thereby suppressing low frequency oscillations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 6:
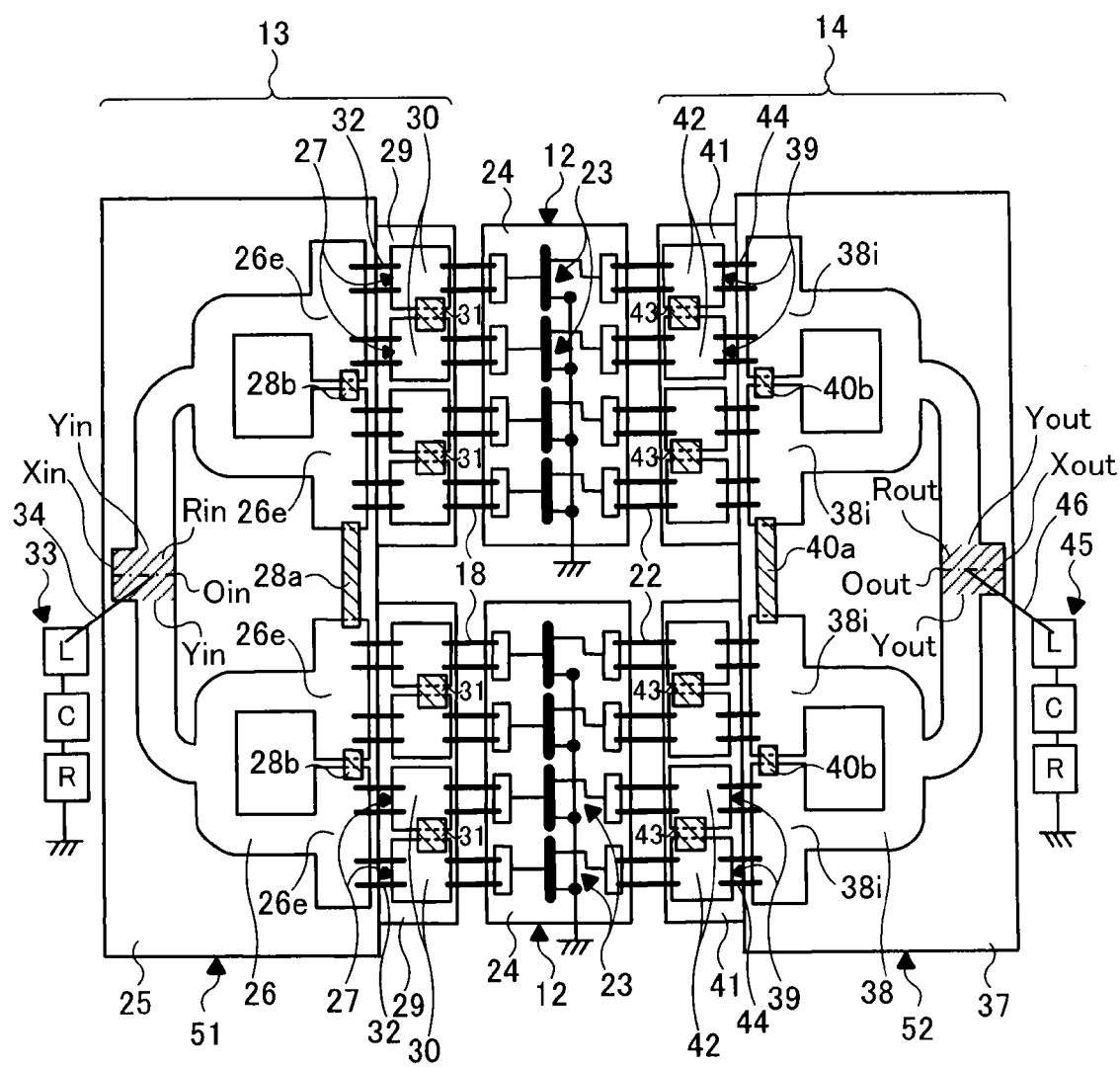
FIG. 6 is a top view schematically illustrating a structure inside a high frequency semiconductor package of a high frequency semiconductor device according to a first variant of the embodiment.

For example, the number of low-frequency-oscillation-suppressing-circuits and their connected positions are not limited to those in the above embodiment. FIG. 6 is a top view schematically illustrating a structure inside a high frequency semiconductor package of a high frequency semiconductor device according to a first variant. As illustrated in FIG. 6, one low-frequency-oscillation-suppressing-circuit 33 is connected to the input dividing/matching circuit 13, and additionally, the other low-frequency-oscillation-suppressing-circuit 45 may be connected to the output combining/matching circuit 14. At this time, the other low-frequency-oscillation-suppressing-circuit 45 is provided such that one end of a wire 46 as the inductor L is connected to the output end Rout of the confluence line 38 on the center axis Oout of the output end Rout of the confluence line 38.

Figure 7:
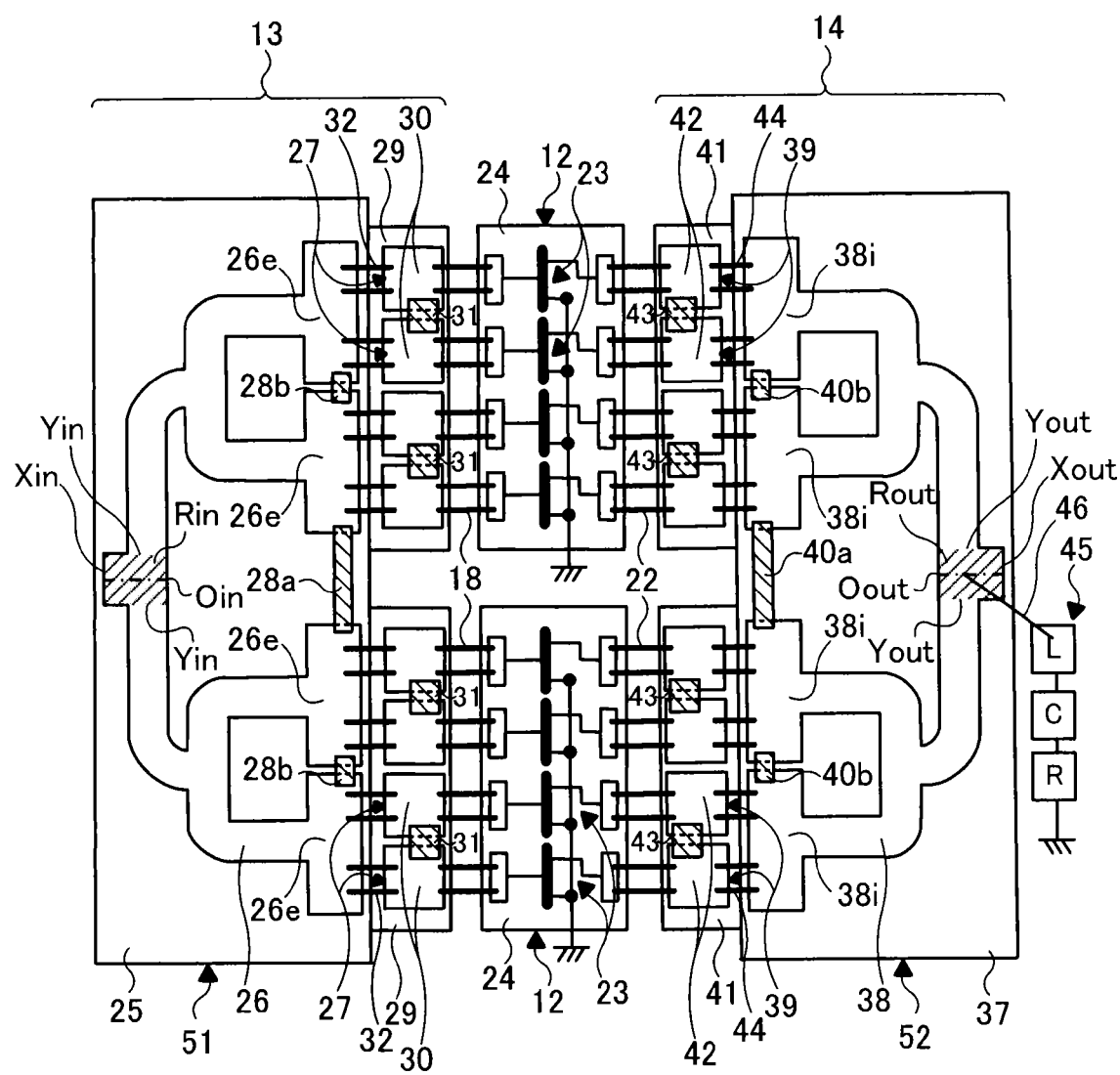
FIG. 7 is a top view schematically illustrating a structure inside a high frequency semiconductor package of a high frequency semiconductor device according to a second variant of the embodiment.

FIG. 7 is a top view schematically illustrating a structure inside a high frequency semiconductor package of a high frequency semiconductor device according to a second variant. As illustrated in FIG. 7, the low-frequency-oscillation-suppressing-circuit 45 may be provided only for the output combining/matching circuit 14 and the low-frequency-oscillation-suppressing-circuit 33 connected to the input dividing/matching circuit 13 may be omitted.

The capacitors and resistors configuring the low-frequency-oscillation-suppressing-circuits 33 and 45 may not be necessarily chip capacitors and chip resistors, respectively.

What is claimed is:

1. A high frequency semiconductor device comprising:
    a plurality of unit FETs;
    an input dividing/matching circuit having a plurality of divided output ends connected to the plurality of unit FETs and an input end, the input dividing/matching circuit being symmetrical about a center axis of the input end;
    an output combining/matching circuit having a plurality of divided input ends connected to the plurality of unit FETs and an output end, the output combining/matching circuit being symmetrical about a center axis of the output end; and
    a resistor, an inductor and a capacitor (RLC) low-frequency-oscillation-suppressing-circuit connected between at least one of the input end of the input dividing/matching circuit and the output end of the output combining/matching circuit and ground,
    wherein the input dividing/matching circuit and the output combining/matching circuit are in a line symmetrical shape about a symmetric axis which is a straight line passing through the input end of the input dividing/matching circuit and the output end of the output combining/matching circuit.

2. The high frequency semiconductor device according to claim 1,
    wherein the resistor, an inductor and a capacitor (RLC) low-frequency-oscillation-suppressing-circuit is connected to the input end of the input dividing/matching circuit.

3. The high frequency semiconductor device according to claim 2,
    wherein the resistor, an inductor and a capacitor (RLC) low-frequency-oscillation-suppressing-circuit is connected to the input end on the symmetric axis of the input end of the input dividing/matching circuit.

4. The high frequency semiconductor device according to claim 3,
    wherein the resistor, an inductor and a capacitor (RLC) low-frequency-oscillation-suppressing-circuit is formed by connecting a wire, a chip capacitor and a chip resistor in series, and
    the wire is connected to the input end on the symmetric axis of the input end of the input dividing/matching circuit.

5. The high frequency semiconductor device according to claim 4,
    wherein the low-frequency-oscillation-suppressing-circuit includes the wire and the chip capacitor which suppresses oscillations of a low frequency of a MHz order of the input dividing/matching circuit and the output combining/matching circuit.

6. The high frequency semiconductor device according to claim 2,
    wherein a resistor is provided between the plurality of divided output ends of the input dividing/matching circuit, and a resistor is provided between the plurality of divided input ends of the output combining/matching circuit.

7. The high frequency semiconductor device according to claim 6,
    wherein the number of divided output ends of the input dividing/matching circuit matches with the number of the plurality of unit FETs, and the number of divided input ends of the output combining/matching circuit matches with the number of the plurality of unit FETs.

8. The high frequency semiconductor device according to claim 1,
    wherein the resistor, an inductor and a capacitor (RLC) low-frequency-oscillation-suppressing-circuit is connected to the output end of the output combining/matching circuit.

9. The high frequency semiconductor device according to claim 8,
wherein the low-frequency-oscillation-suppressing-circuit is connected to the output end on the symmetric axis of the output end of the output combining/matching circuit.

10. The high frequency semiconductor device according to claim 9,
wherein the resistor, an inductor and a capacitor (RLC) low-frequency-oscillation-suppressing-circuit is formed by connecting a wire, a chip capacitor and a chip resistor in series, and
the wire is connected to the output end on the symmetric axis of the output end of the output combining/matching circuit.

11. The high frequency semiconductor device according to claim 10,
wherein the resistor, an inductor and a capacitor (RLC) low-frequency-oscillation-suppressing-circuit includes the wire and the chip capacitor which suppresses oscillations of a low frequency of a MHz order of the input dividing/matching circuit and the output combining/matching circuit.

12. The high frequency semiconductor device according to claim 8,
wherein a resistor is provided between the plurality of divided output ends of the input dividing/matching circuit, and a resistor is provided between the plurality of divided input ends of the output combining/matching circuit.

13. The high frequency semiconductor device according to claim 12,
wherein the number of divided output ends of the input dividing/matching circuit matches with the number of the plurality of unit FETs, and the number of divided input ends of the output combining/matching circuit matches with the number of the plurality of unit FETs.

14. A high frequency semiconductor device comprising:
a plurality of unit FETs;
an input dividing/matching circuit having a plurality of divided output ends connected to the plurality of unit FETs and an input end, the input dividing/matching circuit being symmetrical about a center axis of the input end;
an output combining/matching circuit having a plurality of divided input ends connected to the plurality of unit FETs and an output end, the output combining/matching circuit being symmetrical about a center axis of the output end; and
a plurality of resistor, an inductor and a capacitor (RLC) low-frequency-oscillation-suppressing-circuits connected between the input end of the input dividing/matching circuit and the output end of the output combining/matching circuit and ground,
wherein the input dividing/matching circuit and the output combining/matching circuit are in a line symmetrical shape about a symmetric axis which is a straight line passing through the input end of the input dividing/matching circuit and the output end of the output combining/matching circuit.

15. The high frequency semiconductor device according to claim 14,
wherein the low-frequency-oscillation-suppressing-circuit connected to the input end of the input dividing/matching circuit is connected to the input end on a center axis of the input end of the input dividing/matching circuit, and
the low-frequency-oscillation-suppressing-circuit connected to the output end of the output combining/matching circuit is connected to the output end on a center axis of the output end of the output combining/matching circuit.

16. The high frequency semiconductor device according to claim 15, wherein
each of the low-frequency-oscillation-suppressing-circuits is formed by connecting a wire, a chip capacitor and a chip resistor in series,
the wire of the low-frequency-oscillation-suppressing-circuit connected to the input end of the input dividing/matching circuit is connected to the input end on the center axis of the input end of the input dividing/matching circuit, and
the wire of the low-frequency-oscillation-suppressing-circuit connected to the output end of the output combining/matching circuit is connected to the output end on the center axis of the output end of the output combining/matching circuit.

17. The high frequency semiconductor device according to claim 16,
wherein each of the low-frequency-oscillation-suppressing-circuits include the wire and the chip capacitor of the combination which suppresses oscillations of a low frequency of a MHz order of the input dividing/matching circuit and the output combining/matching circuit.

18. The high frequency semiconductor device according to claim 14,
wherein a resistor is provided between the plurality of divided output ends of the input dividing/matching circuit, and a resistor is provided between the plurality of divided input ends of the output combining/matching circuit.

19. The high frequency semiconductor device according to claim 18,
wherein the number of divided output ends of the input dividing/matching circuit matches with the number of the plurality of unit FETs, and the number of divided input ends of the output combining/matching circuit matches with the number of the plurality of unit FETs.

* * * * *